(12) United States Patent
Min

(10) Patent No.: US 10,410,702 B2
(45) Date of Patent: Sep. 10, 2019

(54) ADDRESS DECODER AND SEMICONDUCTOR MEMORY DEVICE INCLUDING THE SAME

(71) Applicant: SK hynix Inc., Gyeonggi-do (KR)

(72) Inventor: Jin Yong Min, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 15/952,854

(22) Filed: Apr. 13, 2018

(65) Prior Publication Data

US 2019/0180804 A1    Jun. 13, 2019

(30) Foreign Application Priority Data

Dec. 12, 2017 (KR) .................. 10-2017-0170706

(51) Int. Cl.
*G11C 8/10*  (2006.01)
*G11C 5/14*  (2006.01)

(52) U.S. Cl.
CPC . *G11C 8/10* (2013.01); *G11C 5/14* (2013.01)

(58) Field of Classification Search
CPC ....................................................... G11C 8/10
USPC .................................................. 365/230.06
See application file for complete search history.

(56) References Cited

U.S. PATENT DOCUMENTS

| 5,777,943 | A | * | 7/1998 | Kim | ..................... | G11C 8/10 |
|---|---|---|---|---|---|---|
| | | | | | | 365/230.06 |
| 6,064,622 | A | * | 5/2000 | Lee | ..................... | G11C 7/1048 |
| | | | | | | 365/230.06 |
| 6,600,342 | B1 | | 7/2003 | Lee et al. | | |
| 7,230,475 | B2 | | 6/2007 | Choi et al. | | |
| 9,013,950 | B2 | * | 4/2015 | Cha | ..................... | G11C 8/10 |
| | | | | | | 365/189.05 |
| 9,190,122 | B2 | * | 11/2015 | Park | ..................... | G11C 5/148 |

* cited by examiner

*Primary Examiner* — Son L Mai
(74) *Attorney, Agent, or Firm* — IP & T Group LLP

(57) ABSTRACT

An address decoder and a semiconductor memory device including the same are disclosed, which relate to a technology for a decoding circuit configured to decode a column address. The address decoder includes a pre-decoder and a column decoder. The pre-decoder divides a plurality of pre-decoding signals into at least one column address group by decoding column addresses, outputs the pre-decoding signals for each group, and outputs a second pre-decoding signal group which is an inverted signal of a first pre-decoding signal group from among the plurality of pre-decoding signals. The column decoder outputs column selection signals by decoding the plurality of pre-decoding signals in a manner that operation of a metal oxide semiconductor (MOS) transistor is controlled by the first pre-decoding signal group and the second pre-decoding signal group.

20 Claims, 3 Drawing Sheets

ADDRESS DECODER AND SEMICONDUCTOR MEMORY DEVICE INCLUDING THE SAME

CROSS-REFERENCE TO RELATED APPLICATION

This application claims priority to Korean patent application No. 10-2017-0170706, filed on Dec. 12, 2017, the disclosure of which is incorporated herein by reference in its entirety.

BACKGROUND OF THE INVENTION

1. Technical Field

Embodiments of the present disclosure may generally relate to an address decoder and a semiconductor memory device including the same. Particularly, the embodiments relate to a technology for a decoding circuit configured to decode a column address.

2. Related Art

Generally, a semiconductor memory device may select a word line and a bit line using an address received externally, and may access a memory cell coupled between the selected word line and the selected bit line to perform a read or write operation of data.

The semiconductor memory device may include a memory array, a row decoder, a column decoder, a sense amplifier (sense-amp), and plurality of input/output (I/O) line pairs. The memory array may include a plurality of memory cells, and a plurality of word lines and plurality of bit line pairs are coupled to the memory cells.

The row decoder decodes a row address received externally to select some of word lines. The column decoder decodes a column address received externally to select some of column selection lines.

Specifically, each metal oxide semiconductor (MOS) transistor contained in each of the row decoder and the column decoder of the semiconductor memory device configured to use a low power-supply voltage has a very small gate width, such that a leakage current occurs even when there is a small voltage difference between a source and a drain of each MOS transistor in a standby mode of the row decoder and the column decoder.

In this case, when the amount of a leakage current generated in the MOS transistor is very small, the power consumption of the semiconductor memory device is not greatly affected when the number of the row decoders and the number of column decoders are small. However, as the degree of integration of the semiconductor memory devices generally increases, the number of row decoders and the number of column decoders increases proportionally to the increasing integration degree of the semiconductor memory device. Specifically, when the number of row decoders and the number of column decoders increases, the amount of leakage current also increases such that total power consumption of the semiconductor memory device increases.

Recently, systems using semiconductor memory devices have become increasingly smaller and have lower power consumption. Therefore, it is impossible for high power-consumption semiconductor memory devices to be used for small-sized or portable-sized systems, such that commercial viability thereof is greatly decreased. Especially, in a product such as portable electronic devices in which power consumption is an important factor for product competitiveness, a leakage current is directly related to the competitiveness of the product.

BRIEF SUMMARY OF THE INVENTION

Various embodiments of the present disclosure are directed to an address decoder that substantially obviates one or more problems due to limitations and disadvantages of the related art, and a semiconductor memory device including the same.

The embodiment of the present disclosure relates to a technology for reducing a gate leakage current by isolating a gate input of a metal oxide semiconductor (MOS) transistor included in a decoding circuit.

In accordance with an embodiment of the present disclosure, an address decoder includes: a pre-decoder configured to divide a plurality of pre-decoding signals into at least one column address group by decoding column addresses, output the pre-decoding signals for each group, and output a second pre-decoding signal group which is an inverted signal of a first pre-decoding signal group from among the plurality of pre-decoding signals; and a column decoder configured to output column selection signals by decoding the plurality of pre-decoding signals in a manner that operation of a metal oxide semiconductor (MOS) transistor is controlled by the first pre-decoding signal group and the second pre-decoding signal group.

In accordance with another embodiment of the present disclosure, a semiconductor memory device includes: an address decoder configured to output column selection signals by decoding column addresses, and allow operations of respective metal oxide semiconductor (MOS) transistors to be controlled in different voltage levels not only by a first pre-decoding signal group but also by a second pre-decoding signal group which is an inverted signal of the first pre-decoding signal from among a plurality of pre-decoding signals acquired by decoding of the column addresses; and a cell array configured to access cell data selected by the column selection signal.

In accordance with another embodiment of the present disclosure, a pre-decoder suitable for generating first and second pre-decoding signals opposite to each other; an driver suitable for pull-up driving and pull-down driving the first pre-decoding signal; and an output driver suitable for pull-up driving and pull-down driving an output of the input driver to generate a column selection signal, wherein the output driver pull-down drives the output of the driver by using the second pre-decoding signal.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Figure 1:
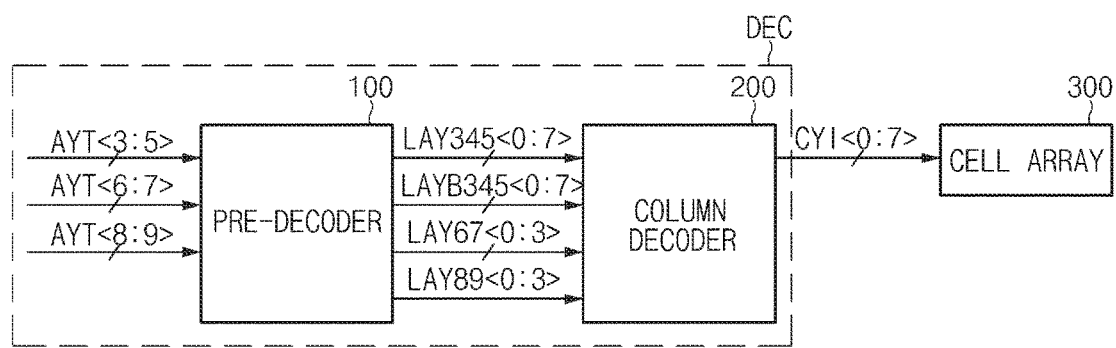
FIG. 1 is a block diagram illustrating an example of a semiconductor memory device according to an embodiment of the present disclosure.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, the various embodiments of the present invention will be described in detail with reference to the attached drawings.

FIG. 1 is a block diagram illustrating an example of a semiconductor memory device according to an embodiment of the present disclosure.

Referring to FIG. 1, the semiconductor memory device may include an address decoder DEC and a cell array 300. The address decoder DEC may include a pre-decoder 100 and a column decoder 200.

In order to access a specific memory cell, the address decoder DEC may generate a column selection signal CYI by decoding column addresses AYT<3:9> received from an external part.

The pre-decoder 100 may output pre-decoding signals LAY345<0:7>, LAYB345<0:7>, LAY67<0:3>, and LAY89<0:3> by decoding the column addresses AYT<3:9>. The pre-decoder 100 may divide the input column addresses AYT<3:9> into one or more column address groups, and may decode the respective column address groups. That is, the pre-decoder 100 may divide the column addresses AYT<3:9> into a plurality of column address groups AYT<3:5>, AYT<6:7>, and AYT<8:9>, and may decode the respective column address groups AYT<3:5>, AYT<6:7>, and AYT<8:9>.

The pre-decoder 100 may output the pre-decoding signals LAY345<0:7>, LAYB345<0:7>, LAY67<0:3>, and LAY89<0:3> corresponding to the respective column address groups. In this case, the pre-decoding signals LAY345<0:7> and LAYB345<0:7> may be used to drive respective MOS transistors of the column decoder 200. The pre-decoding signals LAY67<0:3> and LAY89<0:3> may be enable signals for selectively activating operation of the column decoder 200.

The column decoder 200 may decode the pre-decoding signals LAY345<0:7>, LAYB345<0:7>, LAY67<0:3>, and LAY89<0:3>, and may thus output column selection signals CYI<0:7>. The column decoder 200 may divide the pre-decoding signals LAY345<0:7>, LAYB345<0:7>, LAY67<0:3>, and LAY89<0:3> into one or more groups, may decode the respective pre-decoding signals LAY345<0:7>, LAYB345<0:7>, and LAY67<0:3>, LAY89<0:3>, and may output a plurality of column selection signals CYI<0:7>.

When the column selection signals CYI<0:7> are activated during a write operation, data loaded on input/output (I/O) lines may be transmitted to a bit line. When data is applied to the bit line, a sense-amplifier (not shown) may amplify data loaded on the bit line, and may output the amplified data to a cell array 300. The cell array 300 may access cell data selected by the column selection signals CYI<0:7> received from the column decoder 200.

In accordance with an embodiment of the present disclosure, although the column addresses AYT<3:9> are composed of 7 bits, the pre-decoding signals LAY345<0:7> are composed of 8 bits, each of the pre-decoding signals LAY67<0:3> and LAY89<0:3> is composed of 4 bits, and the column selection signals CYI<0:7> are composed of 8 bits, this is merely for convenience of description and better understanding of the present disclosure, and the number of bits of each address and the number of bits of each signal are not limited thereto. That is, the number of bits of each address and the number of bits of each signal may change without departing from the scope or spirit of the present disclosure.

Figure 2:
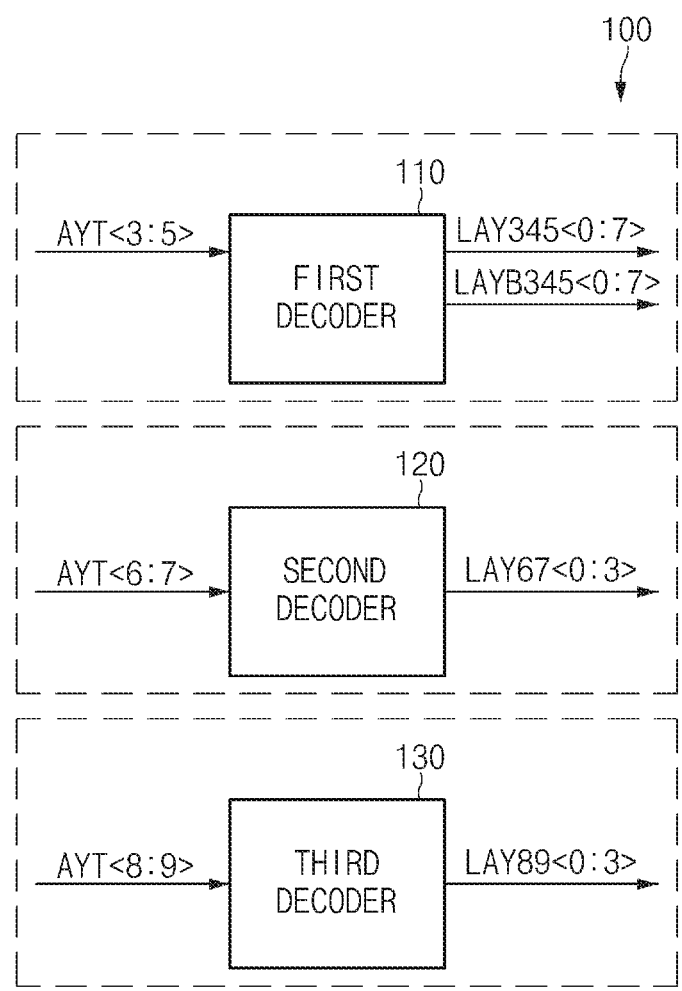
FIG. 2 is a block diagram illustrating an example of a pre-decoder illustrated in FIG. 1.

FIG. 2 is a block diagram illustrating an example of the pre-decoder 100 illustrated in FIG. 1.

Referring to FIG. 2, the pre-decoder 100 may include a plurality of decoders 110, 120, and 130 corresponding to the respective column address groups, such that the pre-decoder 100 may decode the plurality of column addresses AYT<3:9> divided into the plurality of column address groups. In this case, each of the decoders 110, 120, and 130 may be driven using a power-supply voltage VDD2 (shown in FIG. 3) as a source voltage.

In this case, the first decoder 110 may decode the column address group AYT<3:5>, and may thus output the pre-decoding signal group LAY345<0:7> and the pre-decoding signal group LAYB345<0:7>. The first decoder 110 may generate the pre-decoding signal group LAYB345<0:7> by inverting the pre-decoding signal group LAY345<0:7>.

In accordance with the embodiment of the present disclosure, in order to isolate a signal applied to each gate terminal of a metal oxide semiconductor (MOS) transistor of the column decoder 200, the pre-decoding signal group LAYB345<0:7> which is an inverted signal of the pre-decoding signal group LAY345<0:7> may be generated.

The second decoder 120 may decode the column address group AYT<6:7>, and may thus output the pre-decoding signal group LAY67<0:3>. The third decoder 130 may decode the column address group AYT<8:9>, and may thus output the pre-decoding signal group LAY89<0:3>.

Figure 3:
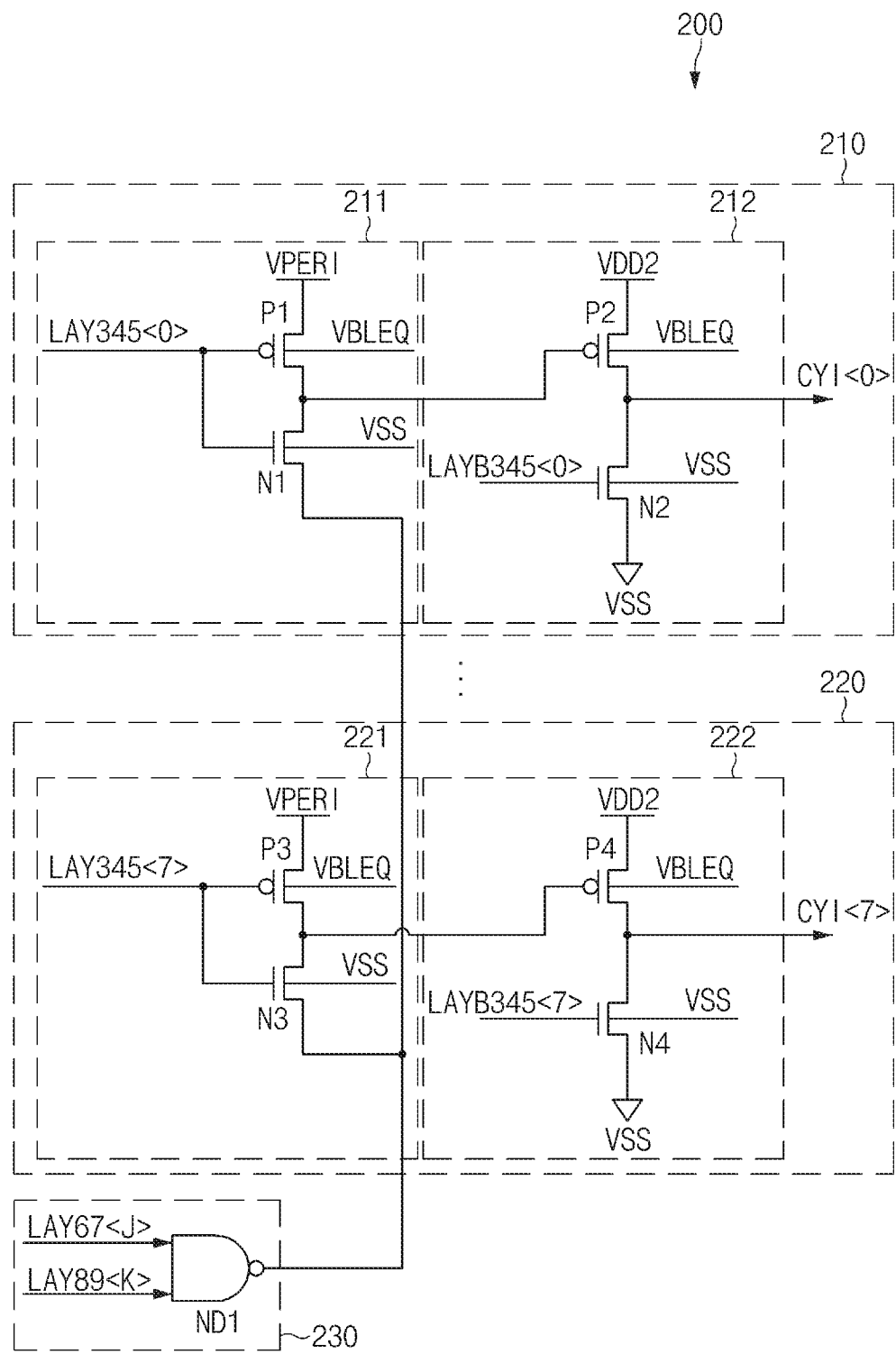
FIG. 3 is a detailed circuit diagram illustrating an example of a column decoder illustrated in FIG. 2.

FIG. 3 is a detailed circuit diagram illustrating an example of the column decoder 200 illustrated in FIG. 2.

Referring to FIG. 3, the column decoder 200 may include a plurality of column selection signal generation circuits 210 and 220 and an enable controller 230.

The respective column selection signal generation circuits 210 and 220 may decode the pre-decoding signal groups LAY345<0:7> and LAYB345<0:7>, and may thus output the column selection signals CYI<0:7>. The enable controller 230 may selectively control an enable state of each column selection signal generation circuit 210 or 220 in response to the pre-decoding signal group LAY67<0:3> or LAY89<0:3>.

Since the column selection signal generation circuits 210 and 220 may be substantially identical in structure to each other except for the fact that they have different input signals and different output signals, the embodiment of the present disclosure exemplarily discloses only the first column selection signal generation circuit 210 and the last column selection signal generation circuit 220 for convenience of description and illustrative purposes.

The column selection signal generation circuit 210 may drive the first pre-decoding signals LAY345<0> and LAYB345<0>, and may thus output the first column selection signal CYI<O>. The column selection signal generation circuit 220 may drive the last pre-decoding signals LAY345<7> and LAYB345<7>, and may thus output the last column selection signal CYI<7>. The column selection signal generation circuit 210 may include a driver 211 and an output driver 212.

The driver 211 may drive the pre-decoding signal LAY345<0> to a level of an internal voltage VPERI, and may thus output the resultant pre-decoding signal LAY345<0>. In this case, the internal voltage VPERI may denote a peripheral circuit voltage (hereinafter, referred to as a "peri-voltage"), and may be generated from the inside of the semiconductor device. The internal voltage VPERI may be set to a voltage that is higher than the power-supply voltage VDD2 by a predetermined level.

Although the embodiment of the present disclosure has exemplarily disclosed that the internal voltage VPERI of the driver 211 is set to a peri-voltage level, the scope or spirit of the present disclosure is not limited thereto. That is, the internal voltage may also be set to a core voltage VCORE, an internal power-supply voltage VDDI, or the like.

The driver 211 may include a PMOS transistor P1 as a pull-up drive element and an NMOS transistor N1 as a pull-down drive element coupled in series between an input terminal of the internal voltage VPERI and an output terminal of the enable controller 230. The PMOS transistor P1 and the NMOS transistor N1 may receive the pre-decoding signal LAY345<0> through a common gate terminal. The PMOS transistor P1 and the NMOS transistor N1 may be coupled to the output driver 212 through a common drain terminal.

The PMOS transistor P1 may receive a bit-line equalizing voltage VBLEQ through a bulk terminal, and the NMOS transistor N1 may receive a ground voltage VSS. The bit-line equalizing voltage VBLEQ may denote a voltage level for equalizing the bit line, and may be higher in level than the power-supply voltage VDD.

The output driver 212 may include a PMOS transistor P2 as a pull-up drive element and an NMOS transistor N2 as a pull-down drive element coupled in series between an input terminal of the power-supply voltage VDD2 and an input terminal of the ground voltage VSS.

The PMOS transistor P2 may receive an output signal of the driver 211 through a gate terminal thereof. The NMOS transistor N2 may receive the pre-decoding signal LAYB345<0> through a gate terminal thereof.

The PMOS transistor P2 and the NMOS transistor N2 may output the column selection signal CYI<0> through a common drain terminal. The PMOS transistor P2 may receive the bit-line equalizing voltage VBLEQ through a bulk terminal, and the NMOS transistor N2 may receive the ground voltage VSS.

The column selection signal generation circuit 220 may include a driver 221 and an output driver 222.

The driver 221 may drive the pre-decoding signal LAY345<7> at an internal voltage VPERI level, and may thus output the resultant pre-decoding signal LAY345<7>.

The output driver 221 may include a PMOS transistor P3 as a pull-up drive element and an NMOS transistor N3 as a pull-down drive element coupled in series between the input terminal of the internal voltage VPERI and the output terminal of the enable controller 230.

The PMOS transistor P3 and the NMOS transistor N3 may receive the pre-decoding signal LAY345<7> through a common gate terminal. The PMOS transistor P3 and the NMOS transistor N3 may be coupled to the output driver 222 through a common drain terminal. The PMOS transistor P3 may receive the bit-line equalizing voltage VBLEQ through a bulk terminal, and the NMOS transistor N3 may receive the ground voltage VSS.

The output driver 222 may include a PMOS transistor P4 as a pull-up drive element and an NMOS transistor N4 as a pull-down drive element coupled in series between the power-supply voltage VDD2 input terminal and the ground voltage VSS input terminal. In this case, the PMOS transistor P4 may receive the output signal of the driver 221 through a gate terminal thereof. The NMOS transistor N4 may receive the pre-decoding signal LAYB345<7> through a gate terminal thereof.

The PMOS transistor P4 and the NMOS transistor N4 may output the column selection signal CYI<7> through a common drain terminal. The PMOS transistor P4 may receive the bit-line equalizing voltage VBLEQ through a bulk terminal, and the NMOS transistor N4 may receive the ground voltage VSS.

The enable controller 230 may perform a logic operation between the pre-decoding signals LAY67<0:3> and LAY89<0:3>, and may output the logic operation result to each of the drivers 211 and 221. The enable controller 230 may include a NAND gate ND1 configured to perform a NAND operation between the pre-decoding signal LAY67<J> and the pre-decoding signal LAY89<K>. In this case, since a combination of the pre-decoding signals LAY67<0:3> and LAY89<0:3> as input signals to the enable controller 230 may be changed, the pre-decoding signal LAY67<0:3> will hereinafter be denoted by 'J' and the pre-decoding signal LAY89<0:3> will hereinafter be denoted by 'K', as illustrated in FIG. 3.

When the pre-decoding signal LAY67<J> and the pre-decoding signal LAY89<K> are activated to a high level, the enable controller 230 may output a low-level voltage to source terminals of the NMOS transistors N1 and N3 of the drivers 211 and 221.

Operations of the column decoder 200 including the above-mentioned constituent elements will hereinafter be described.

Since the column selection signal generation circuit 210 and the last column selection generation circuit 220 of the column decoder 200 are substantially identical in structure and operation to each other except for the fact that they have different input signals and different output signals, only the operation of the column selection signal generation circuit 210 will hereinafter be described for convenience of description and better understanding of the present disclosure.

When the read or write operation of the cell array 300 is performed, the pre-decoding signal LAY345<0> is at a high level. When the high-level pre-decoding signal LAY345<0> is applied to the column decoder 200, the PMOS transistor P1 may be turned off and the NMOS transistor N1 may be turned on. When the NMOS transistor N1 is turned on, the driver 211 may output a low-level output signal.

In this case, the pre-decoding signal LAYB345<0> is at a low level, such that the NMOS transistor N2 may be turned off. When the driver 211 outputs a low-level output signal, the PMOS transistor P2 is turned on, such that the column selection signal CYI<0> is output at a high level.

In the meantime, when the cell array 300 does not perform the read or write operation of the semiconductor memory device, the pre-decoding signal LAY345<0> is at a low level.

When the low-level pre-decoding signal LAY345<0> is applied to the driver 211, the PMOS transistor P2 may be turned on and the NMOS transistor N1 may be turned off. When the PMOS transistor P1 is turned on, the driver 211 may output a high-level output signal.

When the output signal of the driver 211 is at a high level, the PMOS transistor P2 may be turned off. Since the pre-decoding signal LAYB345<0> is an inverted signal of the pre-decoding signal LAY345<0>, the NMOS transistor N2 is turned on when the pre-decoding signal LAYB345<0> is at a high level. As a result, the column selection signal CYI<0> is output at a low level.

When the column selection signal CYI<0> is output at a low level, a leakage current may occur in a ground terminal through the NMOS transistor N2. Moreover, more than thousands of output drivers 212 may be present according to capacities of the memory device, such that a leakage current generated when the MOS transistor is turned off may occupy a significant proportion of a total operating current of the memory device.

Specifically, a negative gate bias (NGB) may be used to reduce an off leakage current of the PMOS transistor P2. When using the negative gate bias (NGB), a voltage level applied to a gate terminal of the PMOS transistor P2 is higher than a voltage level of a source terminal of the PMOS transistor P2, resulting in reduction of the off leakage current.

However, when the gate terminal of the PMOS transistor P2 is commonly coupled to the gate terminal of the NMOS transistor N2, a voltage level applied to the gate terminal of the NMOS transistor N2 may increase. As a result, a gate leakage current of the NMOS transistor N2 may increase. When the leakage current of a turned-off transistor is not controlled, a total current consumption may unavoidably increase, and the operating characteristics may deteriorate.

Therefore, the embodiment of the present disclosure may isolate a signal applied to the gate terminal of the PMOS transistor P2 and a signal applied to the gate terminal of the NMOS transistor N2 from each other. That is, the gate terminal of the PMOS transistor P2 may not be commonly coupled to the gate terminal of the NMOS transistor N2, and the NMOS transistor N2 may receive the pre-decoding signal LAYB345<0> which is an inverted signal of the pre-decoding signal LAY345<0> through the gate terminal thereof.

In this case, the gate terminal of the PMOS transistor P2 may receive a voltage level of the internal voltage VPERI minus threshold voltage (VPERI–VT), such that a voltage higher than the power-supply voltage VDD2 is applied to the gate terminal of the PMOS transistor P2, resulting in Negative Gate Bias (NGB) maintenance. The gate terminal of the NMOS transistor N2 may receive the power-supply voltage VDD2 lower than the internal voltage VPERI. Therefore, a leakage current generated through the NMOS transistor N2 may be reduced, such that the column selection signal CYI<0> may be stably output.

As is apparent from the above description, the address decoder and the semiconductor memory device including the same according to the embodiments may reduce a gate leakage current by isolating a gate input of a MOS transistor included in a decoding circuit.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An address decoder comprising:
   a pre-decoder configured to divide a plurality of pre-decoding signals into at least one column address group by decoding column addresses, output the pre-decoding signals for each group, and output a second pre-decoding signal group which is an inverted signal of a first pre-decoding signal group from among the plurality of pre-decoding signals; and
   a column decoder configured to output column selection signals by decoding the plurality of pre-decoding signals in a manner that operation of a metal oxide semiconductor (MOS) transistor is controlled by the first pre-decoding signal group and the second pre-decoding signal group.

2. The address decoder according to claim 1, wherein the pre-decoder is configured to selectively activate operation of the column decoder upon receiving a third pre-decoding signal group and a fourth pre-decoding signal group from among the plurality of pre-decoding signals.

3. The address decoder according to claim 1, wherein the pre-decoder includes:
   a first decoder configured to output the first pre-decoding signal group by decoding a first column address group, and output the second pre-decoding signal group by decoding the first pre-decoding signal group.

4. The address decoder according to claim 3, wherein the pre-decoder includes:
a second decoder configured to output a third pre-decoding signal group by decoding a second column address group; and
a third decoder configured to output a fourth pre-decoding signal group by decoding a third column address group.

5. The address decoder according to claim 1, wherein the pre-decoder is driven using a power-supply voltage as a source voltage.

6. The address decoder according to claim 1, wherein the column decoder includes:
a plurality of column selection signal generation circuits configured to output a plurality of column selection signals in response to the first pre-decoding signal group and the second pre-decoding signal group; and
an enable controller configured to selectively control an activation state of the plurality of column selection signal generation circuits in response to a third pre-decoding signal group and a fourth pre-decoding signal group.

7. The address decoder according to claim 6, wherein each of the plurality of column selection signal generation circuits includes:
a driver configured to drive the first pre-decoding signal group at a level of an internal voltage; and
an output driver configured to control the column selection signals in response to the second pre-decoding signal group, and drive a gate terminal of each MOS transistor at a level of either the internal voltage or a power-supply voltage.

8. The address decoder according to claim 7, wherein the internal voltage is higher in level than the power-supply voltage.

9. The address decoder according to claim 7, wherein the driver includes:
a first pull-up drive element and a first pull-down drive element coupled in series between an input terminal of the internal voltage and an output terminal of the enable controller,
wherein the first pull-up drive element and the first pull-down drive element receive the first pre-decoding signal group through a common gate terminal, and are coupled to the output driver through a common drain terminal.

10. The address decoder according to claim 9, wherein the first pull-up drive element receives a bit-line equalizing voltage higher than a power-supply voltage through a bulk terminal.

11. The address decoder according to claim 9, wherein the first pull-down drive element receives a ground voltage through a bulk terminal.

12. The address decoder according to claim 7, wherein the output driver includes:
a second pull-up drive element coupled between an input terminal of the power-supply voltage and an output terminal of the column selection signal, and configured to receive an output signal of the driver through a gate terminal; and
a second pull-down drive element coupled between an output terminal of the column selection signal and a ground voltage terminal, and configured to receive the second pre-decoding signal group through a gate terminal.

13. The address decoder according to claim 12,
wherein the second pull-up drive element is configured to receive a bit-line equalizing voltage higher than the power-supply voltage through a bulk terminal,
wherein the second pull-down drive element is configured to receive a ground voltage through a bulk terminal.

14. The address decoder according to claim 12, wherein the output driver enables a voltage applied to the gate terminal of the second pull-up drive element to be controlled at the level of the internal voltage, and enables the second pre-decoding signal group, that uses the power-supply voltage as a source voltage, to be applied to the gate terminal of the second pull-down drive element.

15. The address decoder according to claim 6, wherein the enable controller is configured to output a low-level voltage when both the third pre-decoding signal group and the fourth pre-decoding signal group are activated.

16. A semiconductor memory device comprising:
an address decoder configured to output a column selection signal by decoding column addresses, and allow operations of respective metal oxide semiconductor (MOS) transistors to be controlled in different voltage levels not only by a first pre-decoding signal group but also by a second pre-decoding signal group which is an inverted signal of the first pre-decoding signal group from among a plurality of pre-decoding signals acquired by decoding of the column addresses; and
a cell array configured to access cell data selected by the column selection signal.

17. The semiconductor memory device according to claim 16, wherein the address decoder includes:
a pre-decoder configured to divide the plurality of pre-decoding signals into at least one column address group by decoding the column addresses, and output the first pre-decoding signal group and the second pre-decoding signal group; and
a column decoder configured to output the column selection signal by decoding the plurality of pre-decoding signals in a manner that operations of the respective MOS transistors are controlled by the first pre-decoding signal group and the second pre-decoding signal group.

18. The semiconductor memory device according to claim 17, wherein the column decoder includes:
a plurality of column selection signal generation circuits configured to output a plurality of column selection signals in response to the first pre-decoding signal group and the second pre-decoding signal group; and
an enable controller configured to selectively control an activation state of the plurality of column selection signal generation circuits in response to a third pre-decoding signal group and a fourth pre-decoding signal group.

19. The semiconductor memory device according to claim 18, wherein each of the plurality of column selection signal generation circuits includes:
a driver configured to drive the first pre-decoding signal group at a level of an internal voltage; and
an output driver configured to control the column selection signal in response to the second pre-decoding signal group, and drive a gate terminal of each MOS transistor at a level of either the internal voltage or a power-supply voltage less than the internal voltage.

20. An address decoder comprising:
a pre-decoder suitable for generating a first pre-decoding signal and a second pre-decoding signal opposite to each other;

an driver configured to receive the first pre-decoding signal, and pull-up drive a first pull-up drive element and pull-down drive a first pull-down element; and an output driver configured to pull-up drive a second pull-up drive element and pull-down drive a second pull-down drive element based on an output of the driver to generate a column selection signal, wherein the output driver drives the second pull-down drive element by using the second pre-decoding signal.

\* \* \* \* \*